United States Patent [19]

Muramatsu et al.

[11] Patent Number: 5,373,204

[45] Date of Patent: Dec. 13, 1994

[54] SELF-TIMED CLOCKING TRANSFER CONTROL CIRCUIT

[75] Inventors: Tsuyoshi Muramatsu, Tenri; Manabu Onozaki, Nara, both of Japan

[73] Assignee: Sharp Kabushiki Kaisha, Osaka, Japan

[21] Appl. No.: 113,824

[22] Filed: Aug. 31, 1993

[30] Foreign Application Priority Data

Sep. 2, 1992 [JP] Japan .................. 4-234763

[51] Int. Cl.$^5$ ........................... H03K 19/096
[52] U.S. Cl. ........................ 326/93; 377/81; 326/21
[58] Field of Search .............. 307/443, 480, 481; 377/77, 81

[56] References Cited

U.S. PATENT DOCUMENTS

| | | | |
|---|---|---|---|
| 4,679,213 | 7/1987 | Sutherland | 377/77 X |
| 4,995,003 | 2/1991 | Watanabe et al. | 377/77 X |
| 5,003,201 | 3/1991 | Bai | 307/480 X |
| 5,067,069 | 11/1991 | Fite et al. | 364/200 MS |
| 5,109,495 | 4/1992 | Fite et al. | 364/900 MS |
| 5,128,974 | 7/1992 | Maekawa | 377/81 |
| 5,221,866 | 6/1993 | Takatsu | 307/480 X |

FOREIGN PATENT DOCUMENTS 495185 3/1992 Japan .

*Primary Examiner*—David R. Hudspeth

[57] ABSTRACT

A self-timed clocking transfer control circuit includes a flipflop for storing a transition of a transfer request signal to an L level and outputting an H level signal, an inverter for applying a transfer acknowledge signal to a preceding stage, a 5-input NAND gate, and a second signal output circuit for applying a transfer request signal to a succeeding stage in response to a transition of the output of the 5-input NAND gate to the L level. The 5-input NAND gate does not output the L level unless the transfer request signal from the preceding stage, the output of the flipflop, the transfer acknowledge signal from the succeeding stage, the transfer request signal output by the self-timed clocking transfer control circuit itself, and the prohibition signal are all in the H level. Setting the prohibition signal to the L level, self-synchronous type transfer control can be prohibited. A circuit for generating such a prohibition signal based on a signal for setting an operational mode, a clock signal, and the transfer request signal from the preceding stage may additionally be provided.

9 Claims, 6 Drawing Sheets

SELF-TIMED CLOCKING TRANSFER CONTROL CIRCUIT

BACKGROUND OF THE INVENTION

1. Field of the Invention

The present invention relates generally to self-timed clocking transfer control circuits, and more specifically, to a self-timed clocking transfer control circuit for controlling transfer of a transfer request signal.

2. Description of the Related Art

Data transmission apparatuses employing an asynchronous hand shaking method are sometimes used for data processing apparatuses for input/output of data using an FIFO (First In First Out) memory or for data driven type information processing. In such a data transmission apparatus, a plurality of data transmission circuits are connected in series to constitute a data transmission path, and these data transmission circuits transmit/receive a transfer request signal for data and a transfer acknowledge signal to perform autonomous data transfer. The transfer request signal is a signal requesting a next stage data transmission circuit to receive data. The transfer acknowledge signal is a signal indicating to another data transfer circuit in the preceding stage whether or not to permit data transfer.

FIG. 1 is a block diagram showing one example of a conventional data transmission apparatus employing a hand shaking method. Referring to FIG. 1, the data transmission apparatus includes data transmission circuits 10, 20 and 30, and logic circuits 16, 26, and 36. Circuits 10, 16, 20, 26, 30, and 36 are connected in series in this order. In the data transmission apparatus shown in FIG. 1, data is transferred through data transmission paths 10, 20, and 30, and the data is sequentially processed by logic circuits 16, 26, and 36.

Data transmission circuits 10, 20, and 30 include data holding circuits 12, 22, and 32, and transfer control circuits 14, 24, and 34, respectively.

FIG. 2 is a block diagram showing data transmission circuit 10 shown in FIG. 1. In FIG. 2, although only the part concerning data transmission circuit 10 is illustrated in the form a block diagram, the other transmission circuits 20 and 30 have the same structure as data transmission circuit 10. Therefore, a detailed description of data transmission circuits 20 and 30 is not repeated here.

Referring to FIG. 2, data transmission circuit 10 includes self-timed clocking transfer control circuit 14 and data holding circuit 12 formed of D type flipflops. The self-timed clocking transfer control circuit is defined as in the following. There exists a data transmission control method by which a transfer request signal and a transmission acknowledge signal are transmitted/received between adjacently connected data transmission circuits in a data transmission path, and data transfer is performed asynchronously according to these signals and with at least preset time delays. Such control is called self-synchronous type transfer control. And the circuit for controlling such data transfer is called self-timed clocking transfer control circuit.

Transfer control circuit 14 includes a transfer request signal input terminal (CI input terminal) 40 for receiving a transfer request signal CI (C10) from a preceding stage (not shown), a transfer acknowledge output terminal (RO output terminal) 42 for outputting a transfer acknowledge signal RO (R10) indicating to the preceding stage acknowledgement or prohibition of transfer, a transfer request signal output terminal (CO output terminal) 44 for outputting a transfer request signal CO (C10) to a succeeding stage (not shown), a transfer acknowledge input terminal (RI input terminal) 46 for receiving from the succeeding stage a transfer acknowledge signal RI (R20) indicating acknowledgement or prohibition of transfer, and an output terminal for providing data holding circuit 12 (shown in FIG. 2) with a clock pulse CP for controlling data holding operation.

Upon receiving transfer request signal CI from the preceding stage, transfer control circuit 14 outputs transfer request signal CO to the succeeding stage and clock pulse CP to data holding circuit 12, if transfer acknowledge signal RI from the succeeding stage indicates acknowledgement. Data holding circuit 12 responds to clock pulse CP to hold data DI provided from the preceding stage and provides the held data to the succeeding stage as output data DO.

Referring back to FIG. 1, the CO output terminal of transfer control circuit 14 is connected to the CI input terminal of transfer control circuit 24. A transfer request signal C20 is applied from transfer control circuit 14 to transfer control circuit 24. The CI input terminal of transfer control circuit 34 is connected to the CO output terminal of transfer control circuit 24. A transfer request signal C30 is applied from transfer control circuit 24 to transfer control circuit 34.

The RO output terminal of transfer control circuit 24 is connected to the RI input terminal of transfer control circuit 14. Transfer acknowledge signal R20 is applied from transfer control circuit 24 to transfer control circuit 14. The RO output terminal of transfer control circuit 34 is connected to the RI input terminal of transfer control circuit 24. A transfer acknowledge signal R30 is applied from transfer control circuit 34 to transfer control circuit 24.

The CI input terminal of transfer control circuit 14 is connected to the CO output terminal of the preceding stage which is not shown. Transfer request signal C10 is applied from the transfer control circuit in the preceding stage which is not shown to transfer control circuit 14. The RO output terminal of transfer control circuit 14 is connected to the RI input terminal of the transfer control circuit in the preceding stage which is not shown. Transfer acknowledge signal R10 is applied from transfer control circuit 14 to the transfer control circuit of the preceding stage.

The CO output terminal of transfer control circuit 34 is connected to the CI input terminal of a transfer control circuit in the succeeding stage which is not shown. A transfer request signal C40 is applied from transfer control circuit 34 to the transfer control circuit in the succeeding stage. The RI input terminal of transfer control circuit 34 is connected to the RO output terminal of the transfer control circuit in the succeeding stage which is not shown. A transfer acknowledge signal R40 is applied from the transfer control circuit of the succeeding stage to transfer control circuit 34.

In FIG. 1, even if data transmission circuit 10 holds data, the data is not transferred from data transmission circuit 10 to data transmission circuit 20, if, for example, data transmission circuit 20 in the succeeding stage holds data as well. If data transmission circuit 20 in the succeeding stage does not hold data (or transits to such a state) data held in data transmission circuit 10 is sent to data transmission circuit 20 over at least preset time delay.

FIG. 3 is a circuit diagram showing one example of a conventional self-synchronous transfer control circuit 14.

Referring to FIG. 3, transfer control circuit 14 further includes a master reset signal ($\overline{MR}$) input terminal 48.

Transfer control circuit 14 further includes an RS-flipflop 50, a 4-input NAND gate 52, an RS-flipflop 54, inverters 56 and 58, a delay element 60, and an inverter 62.

RS-flipflop 50 includes cross-connected two NAND gates 70 and 72. NAND gate 72 has three inputs, one of which is a reset input. Another input of NAND gate 72 is connected to the input terminal 48 of master reset signal $\overline{MR}$. One input of NAND gate 70 is a set input 74. The outputs of NAND gates 70 and 72 are connected to each other's remaining inputs. The output of NAND gate 70 is also the Q output 78 of RS-flipflop 50.

A first input of 4-input NAND gate 52 is connected to CI input terminal 40. A second input is connected to the Q output 78 of RS-flipflop 50. A third input is connected to RI input terminal 46. A fourth input is connected to the output of inverter 58. The output G of NAND gate 52 is connected to the reset input of RS-flipflop 54.

RS-flipflop 54 includes cross-connected two NAND gates 80 and 82. NAND gate 82 has three inputs, one of which is a reset input. Another input of NAND gate 82 is connected to the input terminal 48 of master reset signal $\overline{MR}$. One input of NAND gate 80 is a set input 81. The outputs of NAND gates 80 and 82 are connected to each other's remaining inputs. The output of NAND gate 80 is also the Q output 83 of RS-flipflop 54.

The output of inverter 56 becomes clock pulse CP to data holding circuit 12 shown in FIG. 2. The output of inverter 56 is also connected to the input of inverter 58. The output of inverter 58 is connected to the fourth input of NAND gate 52 and the input of delay element 60.

The output of delay element 60 is connected to CO output terminal 44.

The input of inverter 62 is connected to the Q output 78 of flipflop 50. The output of inverter 62 is connected to RO output terminal 42.

In FIG. 3, the pulse-shaped transfer request signal CI from the preceding stage is applied to CI input terminal. Transfer acknowledge signal RO is output from RO output terminal 42 to the preceding stage. The pulse-shaped transfer request signal CO is output from CO output terminal 44 to the succeeding stage. Transfer acknowledge signal RI is applied to RI input terminal 46 from the succeeding stage. Master reset signal $\overline{MR}$ is applied to $\overline{MR}$ input terminal 48.

The operation of RS-flipflop 50 will be briefly described. RS-flipflop 50 is set upon receiving an "L" level pulse $\overline{S}$ at its set input 74. An "H" level signal appears at the Q output 78 of RS-flipflop 50. RS-flipflop 50 is reset upon receiving an "L" level reset pulse $\overline{R}$ at its reset input 76. RS-flipflop 50 outputs the "L" level at its Q output 78. When master reset signal $\overline{MR}$ attains the "L" level, flipflop 50 is reset and the "L" level appears at its Q output 78. Accordingly, an "H" level transfer acknowledge signal RO is output from RO output terminal 42.

The operation of RS-flipflop 54 is the same as that of RS-flipflop 50, and therefore a detailed description thereof is not repeated here. It should be noted that the output of RS-flipflop is a $\overline{Q}$ output.

Note that transmission acknowledge signal RO in its "H" level indicates acknowledgement of transfer, while in its "L" level prohibition of transfer. Transfer request signal CI in its "L" level indicates that data transfer is being requested from the preceding stage, while in its "H" level indicates that data transfer is not requested from the preceding stage.

Referring to FIGS. 3 and 4, transfer control circuit 14 shown in FIG. 3 operates as follows.

An "L" level master reset pulse $\overline{MR}$ is applied to $\overline{MR}$ input terminal 48. In response to this master reset pulse $\overline{MR}$ transfer control circuit 14 is initialized. More specifically, RS-flipflops 50 is reset and RS-flipflop 54 is set. They output an "L" level and an "H" level, respectively. Accordingly, an "H" level transfer acknowledge signal RO is output from RO output terminal 42 (FIG. 4(b)). After a prescribed time delay, an "H" level transfer request signal CO is output from CO output terminal 44 (FIG. 4(e)). The output of inverter 56 is in an "L" level. Clock pulse CP is therefore in an "L" level (FIG. 4(d)).

Based on transfer acknowledge signal RO permitting transfer, a transfer control circuit in the preceding stage (not shown) pulls transfer request signal CI to CI input terminal 40 to an "L" level (FIG. 4(a)). In response, RS-flipflop 50 is set, and the potential of its Q output 78 attains the "H" level. In response, output signal RO from RO output terminal 42 attains the "L" level (the state prohibiting transfer) (FIG. 4(b)). Thus, the preceding stage is prohibited from further transferring data to data transfer circuit 10 including this transfer control circuit 14 (see FIG. 2).

After a prescribed time period, transfer request signal CI at CI input terminal 40 attains the "H" level (FIG. 4(a)). NAND gate 52 outputs "L" to its output node G, when the Q output of RS-flipflop 50 is in the "H" level, transfer request signal CI returns to the "H" level, transfer request signal CO is in the "H" level, and transfer acknowledge signal RI is the "H" level. More specifically, NAND gate 52 outputs the "L" level to its output node G if RS-flipflop 50 stores reception of the data transfer request signal from the preceding stage, if transfer request signal CI returns to the "H" level, if transfer control circuit 14 is not outputting data transfer request signal CO to the succeeding stage which is not shown, and if the succeeding stage outputs transfer acknowledge signal RI indicating permission of transmission (FIG. 4(c)).

When the output node G of NAND gate 52 attains the "L" level, RS-flipflop 50 is reset. RS-flipflop 54 is reset as well. The output of RS-flipflop 54 attains the "L" level. The output of inverter 56 rises to the "H" level. More specifically, clock pulse CP to a corresponding data holding circuit (of the data holding circuits) rises to the "H" level (FIG. 4(d)). Data holding circuit 12 (see FIG. 2) latches input data D in response to clock pulse CP, and sends the latched data as output data DO to logic circuit 16 in the succeeding stage (see FIG. 1).

The output of inverter 56 is further inverted by inverter 58, delayed by delay element 60 by a prescribed time period and output from CO output terminal 44. More specifically, transfer request signal CO attains the "L" level (FIG. 4(e)). Thus, data transfer is request to a transfer control circuit in the succeeding stage. A transfer control circuit of the next stage receives the transfer request signal from transfer control circuit 14.

The transfer control circuit in the succeeding stage (not shown) which has received transfer request signal CO brings its transfer acknowledge signal RI to the "L" level (FIG. 4(f)). More specifically, transfer acknowledge signal RI applied from the succeeding stage to transfer control circuit 14 is prohibited. When transfer acknowledge signal RI attains the "L" level, the signal RI is applied to the set input 84 of RS-flipflop 54 as set signal S. RS-flipflop 54 is set. In response, the output of inverter 54 attains the "L" level, and clock pulse CP attains the "L" level as well (FIG. 4(d)). Transfer request signal CO output from CO output terminal 44 returns to the "H" level (FIG. 4(e)). Thereafter, the data transfer circuit in the succeeding stage further transfers data to a data transfer circuit in the succeeding stage. Then, transfer acknowledge signal RI applied from the data transfer circuit in the succeeding stage to transfer control circuit 14 shown in FIG. 3 returns to the "H" level (FIG. 4(f)). Thus, data transmission circuit 10 (see FIG. 2) is permitted to transfer further data to a data transmission circuit in the next stage.

As described above, in the conventional transfer control circuit, if a data transmission circuit in a succeeding stage is empty, data is autonomously and sequentially transmitted to a data transmission path in the succeeding stage. More specifically, if transfer acknowledge signal RI is in the "H" level, transfer control circuit 14 autonomously transmits data to the data transmission circuit in the succeeding stage. Meanwhile, it is often necessary to control processing so as to gradually proceed data on a stage by stage basis for each data transmission circuit or logic circuit, when transfer timing of each data transmission circuit is to be verified or the content of processing by a logic circuit disposed between data transfer circuits is to be debugged. The conventional transfer control circuit cannot provide such and therefore it is difficult to confirm the operation of data transfer circuits in each stage.

SUMMARY OF THE INVENTION

It is therefore an object of the invention to provide a self-timed clocking transfer control circuit capable of prohibiting or acknowledging transfer operation.

Another object of the invention is to provide a self-timed clocking transfer control circuit capable of prohibiting or acknowledging transfer operation in a desired timing.

Yet another object of the invention is to provide a self-timed clocking transfer control circuit capable of switching operational modes between a mode for prohibiting or acknowledging transfer operation in a desired timing and a mode for performing usual self-synchronous type transfer control operation.

An additional object of the invention is to provide a self-timed clocking transfer control circuit capable of switching operational modes between a mode for performing transfer operation in a desired timing and a mode for performing usual self-synchronous type transfer control operation.

Another additional object of the invention is to provide a self-timed clocking transfer control circuit capable of switching operational modes between a mode for transmitting a transfer request signal to a succeeding stage in a desired timing and a mode for performing usual self-synchronous type transfer control operation.

A further additional object of the invention is to provide a self-timed clocking transfer control circuit capable of switching operational modes between a first mode for transmitting a transfer request signal to a succeeding stage in a desired timing and a second mode for performing usual self-synchronous type transfer control operation, and capable of maintaining the timing characteristics of the self-timed clocking transfer control circuit in the second operational mode as that of the conventional circuit in spite of an additional circuitry required for the first mode operation.

A self-timed clocking transfer control circuit according to the invention is connected to a data holding circuit constituting a data transmission path, and in response to a first signal and a second signal for self-synchronous type transfer control applied from a preceding and a succeeding stage, respectively, applies to the data holding circuit a data holding signal indicating a timing for holding input data, and a third signal and a fourth signal for self-synchronous type transfer control to the preceding stage and the succeeding stage, respectively. The first, second, third, and fourth signals each selectively take either one of first and second values. The self-timed clocking transfer control circuit further operates in response to a prohibition signal indicating whether or not to prohibit self-synchronous type transfer control and selectively taking either one of first and second values. The self-timed clocking transfer control circuit includes a first signal output circuit, a circuit for applying the third signal to the preceding stage, a first logic circuit, and a second signal output circuit. The first signal output circuit starts outputting a prescribed signal in response to the first signal taking the first value, and stops outputting the prescribed signal in response to a reset signal. The circuit for applying the third signal to the preceding stage outputs the third signal in response to the prescribed signal. The first logic circuit performs a prescribed logic operation to the first signal, the second signal, the output of the first signal output circuit, the fourth signal output from the self-timed clocking transfer control circuit itself, and prohibition signal, and outputs the result. The output of the first logic circuit is applied to the first signal output circuit as a reset signal. The second signal output circuit generates the data holding circuit and the fourth signal in response to the output of the first logic circuit and the second signal, and delays the fourth signal for a prescribed time period and outputs the same to the succeeding stage. The logic operation of the first logic circuit is performed so that the second signal generation circuit does not generate the fourth signal when the prohibition signal takes the first value. Accordingly, setting the prohibition signal to the first value prohibits self-synchronous type transfer control.

In another aspect of the present invention, the self-timed clocking transfer control circuit further includes a prohibition signal generation circuit. The prohibition signal generation circuit generates and applies a prohibition signal to the first logic circuit, in response to an external mode signal which takes either one of first and second values indicating a first operational mode and a second operational mode, respectively, an externally applied clock signal instructing transfer of data in the second operational mode, and the first signal. Accordingly, externally changing the value of the mode signal can change the operational mode. Applying the clock signal to the prohibition signal generation circuit in the second operational mode permits selecting the value of the prohibition signal. Since the fourth signal is generated in response to the prohibition signal taking the second value and data is transferred, transfer control can be performed with the clock signal.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

A self-timed clocking transfer control circuit according to one embodiment of the invention which will be described below usually operates in the same manner as described in the section of "BACKGROUND OF THE INVENTION". When a user desires a debugging processing, however, the self-timed clocking transfer control circuit can arbitrarily control transfer of a transfer request signal in response to an externally input signal. Since the operation of each circuit can be traced while data is transmitted on a stage-by-stage basis, verification of timing and debugging of processing content can be performed with respect to logic circuits, transfer control circuits or the like disposed between data transmission circuits.

Figure 5:
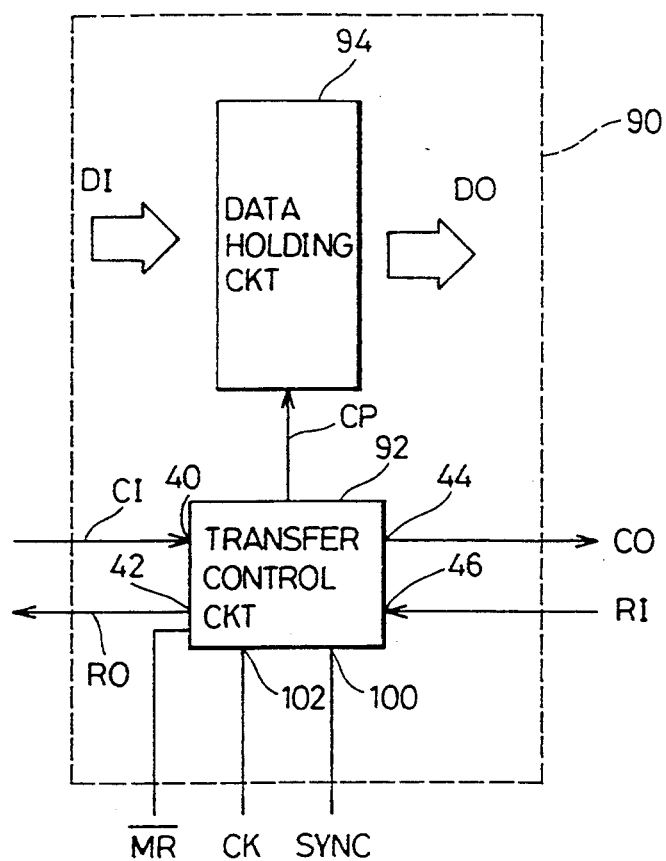
FIG. 5 is a diagram schematically showing the structure of a data transmission circuit including a self-timed clocking transfer control circuit according to one embodiment of the invention.

Referring to FIG. 5, a data transmission circuit 90 according to one embodiment of the present invention includes a transfer control circuit 92 and a data holding circuit 94 including D type flipflops.

Figure 1:
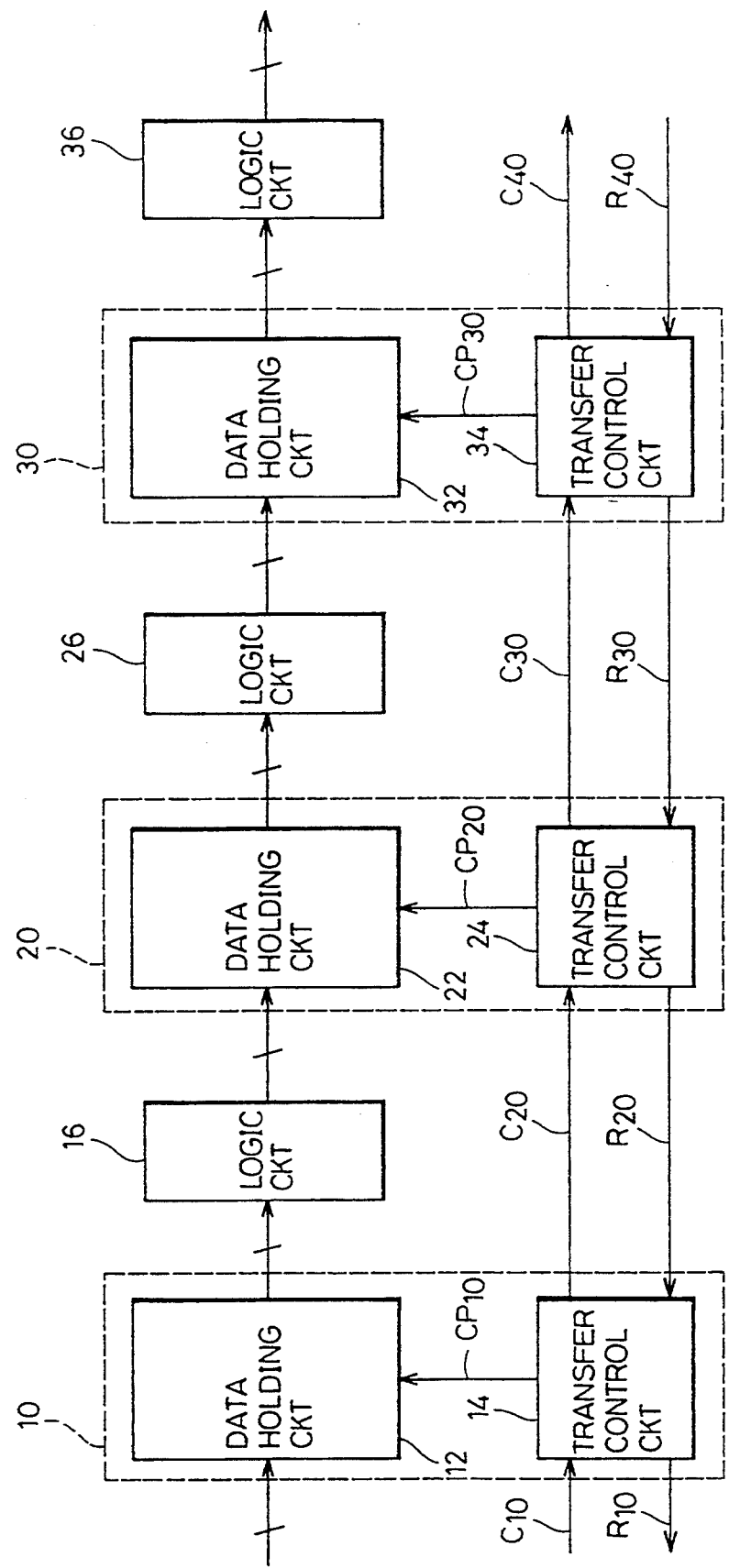
FIG. 1 is a block diagram showing one example of the data transmission apparatus employing the conventional hand shaking method.
Figure 2:
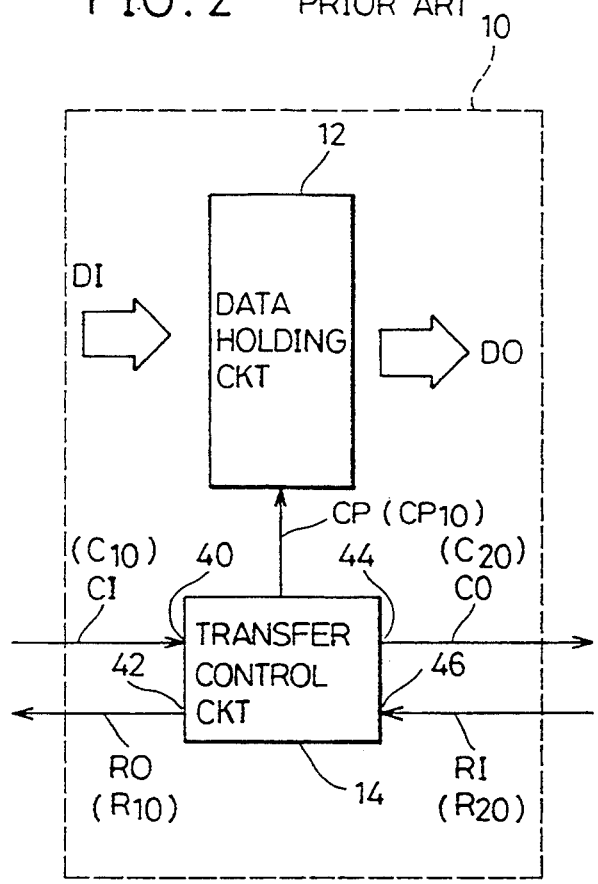
FIG. 2 is a block diagram showing the structure of the data transmission circuit included in the apparatus shown in FIG. 1.

Transfer control circuit 92, similarly to the conventional transfer control circuit 14 described referring to FIG. 2, has a CI input terminal 40, a CP output terminal, a CO output terminal 44, an RI input terminal 46, and an RO output terminal 42. Transfer control circuit 92 further includes an input terminal 100 for a mode signal SYNC, and an input terminal 102 for a clock signal CK. Terminals 100 and 102 are connected to an external control apparatus which is not shown. The external control apparatus is controlled manually or automatically to apply mode signal SYNC to terminal 100, and clock signal CK to terminal 102, respectively.

Mode signal SYNC is a signal for selectively setting transfer control circuit 92 to an autonomous operational mode as described in BACKGROUND OF THE INVENTION or a mode in which transmission of transfer request signal CO is controlled based on clock signal CK applied to terminal 102. Herein, when mode signal SYNC is in the "L" level, transfer control circuit 92 is set to the autonomous operational mode and operates in the same manner as the conventional circuit described in conjunction with FIG. 3. When mode signal SYNC is in the "H" level, transfer control circuit 92 controls transfer of the transfer request signal based on clock signal CK applied to terminal 102.

Figure 3:
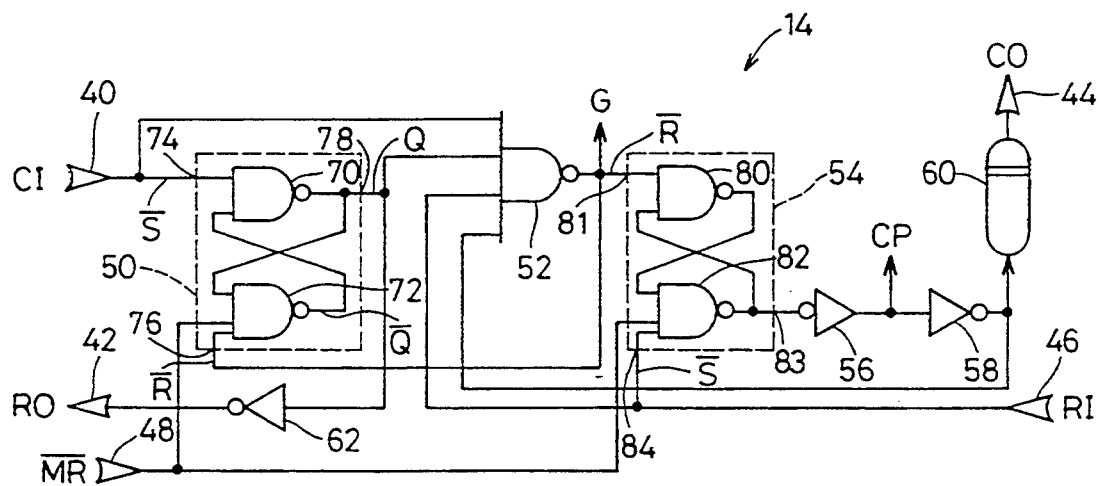
FIG. 3 is a circuit diagram showing one example of the conventional self-timed clocking transfer control circuit.
Figure 4:
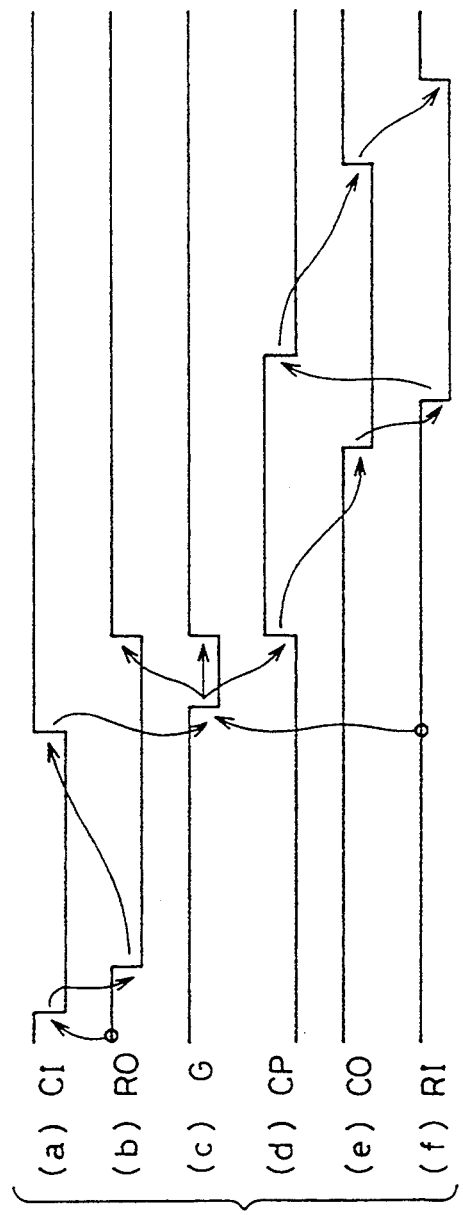
FIG. 4 is a timing chart for use in illustration of operation of the circuit shown in FIG. 3.

In this embodiment, the operation of transfer control circuit 92 when mode signal SYNC is in the "L" level is the same as the conventional self-timed clocking transfer control circuit 14 shown in FIG. 3. Accordingly, a detailed description thereof is not repeated here. In the following, the operation of transfer control circuit 92 when mode signal SYNC is in the "H" level will be mainly described.

Figure 6:
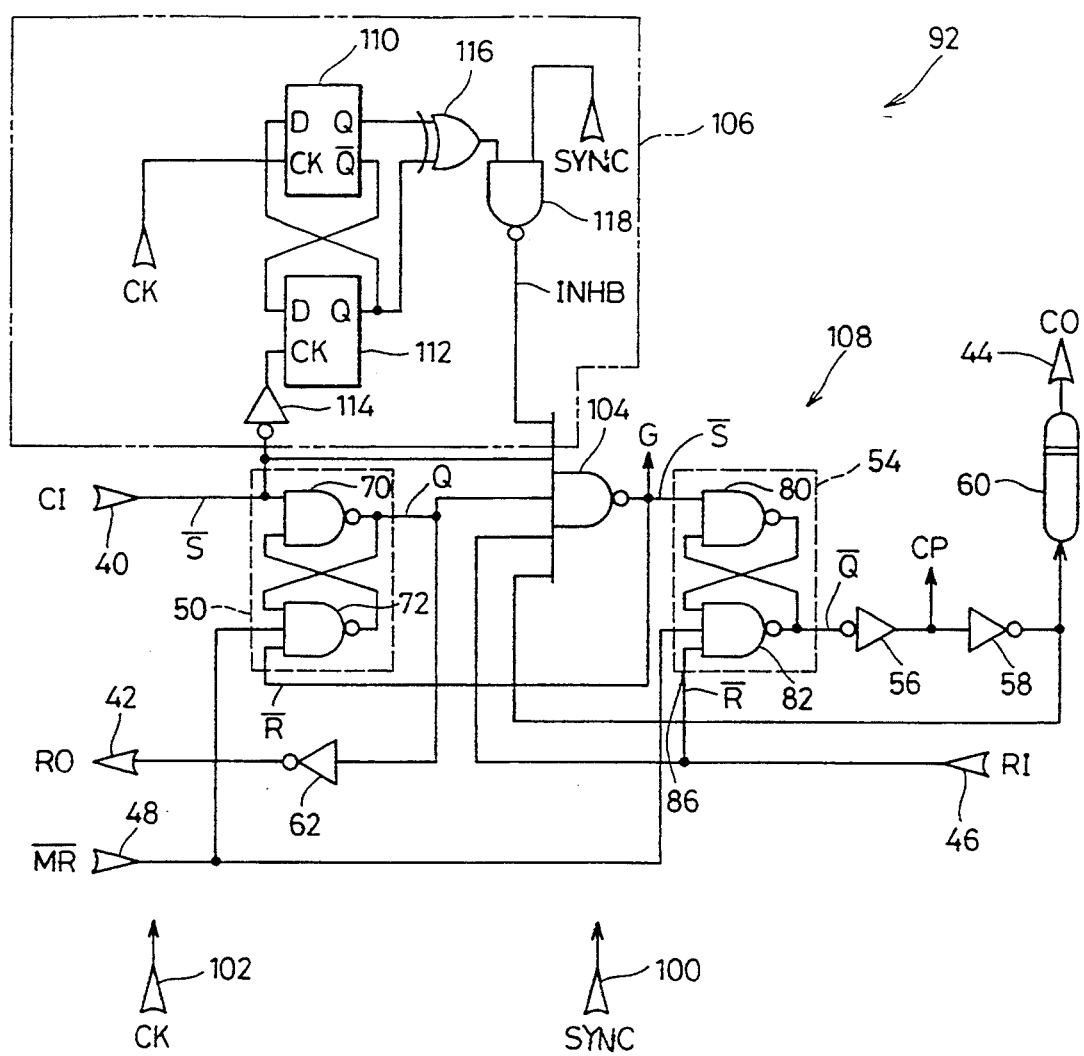
FIG. 6 is a block diagram showing a self-timed clocking transfer control circuit according to one embodiment of the invention.

Referring to FIG. 6, transfer control circuit 92 according to the embodiment of the present invention includes a transfer control portion 108 corresponding to the conventional transfer control circuit 14 shown in FIG. 3, and a transfer request control portion 106. Transfer control portion 108 is different from the conventional transfer control circuit 14 only in that a 5-input NAND gate 104 is included in place of NAND gate 52. Since the other structure of transfer control portion 108 is the same as transfer control circuit 14 shown in FIG. 3, the same components are designated with the same reference numerals and names, and a detailed description thereof will not be repeated here.

NAND gate 104 has first to fifth input nodes. The second-fifth input nodes among them correspond to the first-fourth input nodes of the conventional NAND gate 52 shown in FIG. 3, respectively. The output INHB of transfer request control portion 106 is applied to the first input node of NAND gate 104. The output INHB of transfer request control portion 106 will be described later.

Transfer request control portion 106 includes D type flipflops 110 and 112, an inverter 114, an EXOR gate 116, and an NAND gate 118.

The clock input CK of flipflop 112 is connected to CI input terminal 40 through inverter 114. The D input is connected to the $\overline{Q}$ output of flipflop 110. The Q output is connected to the D input of flipflop 110 and to one input of EXOR gate 116.

The clock input CK of flipflop 110 is connected to input terminal 102 for clock signal CK. The Q output is connected to the other input of EXOR gate 116.

The output INHB of NAND gate 118 is connected to the first input of NAND gate 104 as described above.

Transfer control circuit 92 shown in FIG. 6 operates as follows. First, the normal operational mode and then the debugging mode will be described.

[Normal Operational Mode]

When mode signal SYNC is in the "L" level, transfer control circuit 92 operates as a self-timed clocking transfer control circuit similarly to the conventional apparatus. Referring to FIG. 6, since one input of NAND gate 118 is in the "L" level, output INHB is fixed to the "H" level. The function of NAND gate 104 is equivalent to that of the gate 52 of the conventional transfer control circuit shown in FIG. 3. More specifically, in this mode, transfer request control portion 106 is disabled in transfer control circuit 92. Transfer control circuit 92 operates as a self-timed clocking transfer control circuit similar to the conventional one.

[Debugging Operational Mode]

When mode signal SYNC is the "H" level, transfer control circuit 92 performs a debugging operation as described below. In this mode, transmission of transfer request signal CO is controlled in response to clock signal CK applied to terminal 102.

Figure 7:
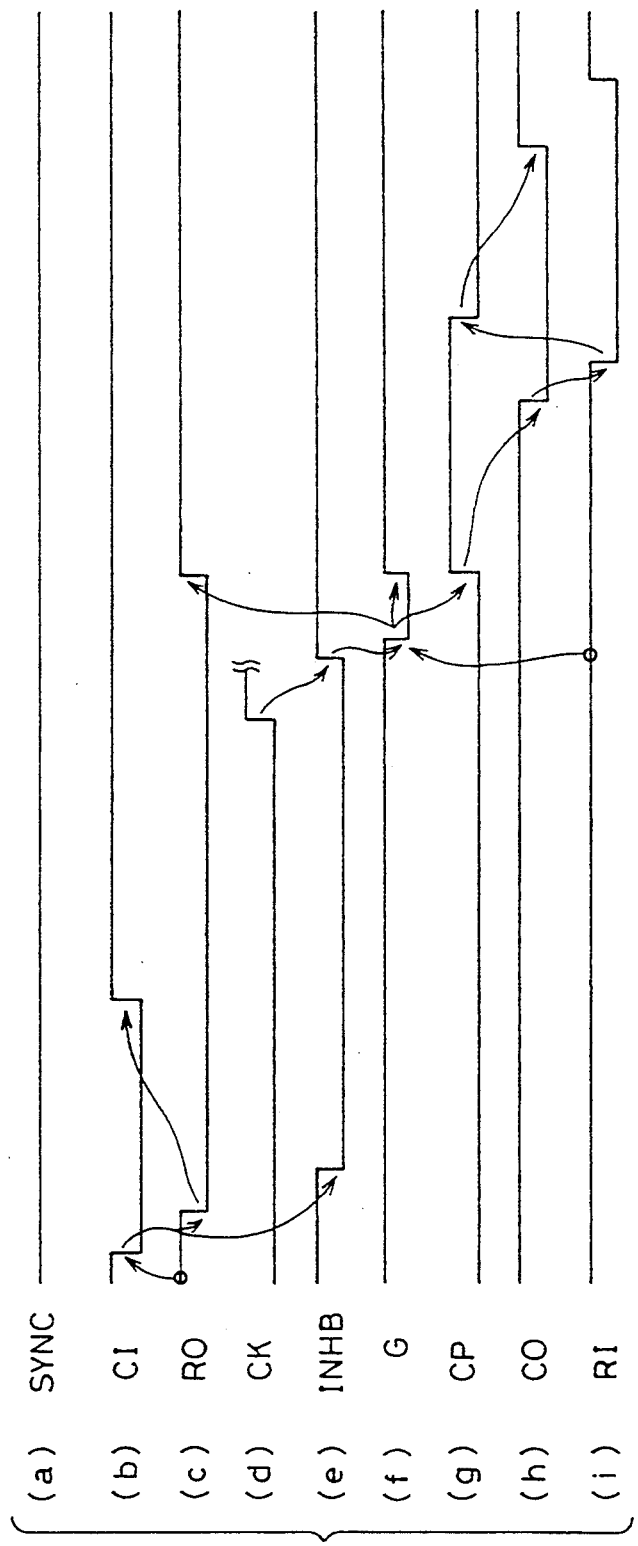
FIG. 7 is a timing chart for use in illustration of operation of the data transmission circuit shown in FIGS. 5 and 6.

Referring to the timing chart FIGS. 7 (a) to (i) and particularly to FIG. 7(a), it is assumed that mode signal SYNC is set to the "H" level by external control and transfer control circuit 92 has been initialized in response to master reset signal $\overline{MR}$.

Based on transfer acknowledging signal RO output from data transmission circuit 90 (see FIG. 5) being in the "H" level, transfer request signal CI requesting data transfer is input to CI input terminal 40 from a data transmission circuit in the preceding stage, and the level of terminal 40 is pulled to the "L" level (FIG. 7(b)). Since RS-flipflop 50 is set, flipflop 50 outputs the "H" level to its Q output. The Q output of flipflop 50 is applied to RO output terminal 42 through inverter 62, and transfer acknowledge signal RO attains the "L" level (FIG. 7(c)). Thus, a transfer control circuit in the preceding stage is prohibited from transferring new data.

Meanwhile, transfer request signal CI applied to CI input terminal 40 is applied to the clock input CK of D type flipflop 112 through inverter 114. D type flipflop 112 receives transfer request signal CI at its clock input CK, and latches the $\overline{Q}$ output of D type flipflop 110 in response to a rising of the signal level to the "H" level. As a result, the Q outputs of D type flipflops 110 and 112 become different from each other. Since the inputs of EXOR gate 116 attain different levels from each other, the output of EXOR gate 116 attains the "H" level. Finally, the output INHB of NAND gate 118 attains the "L" level (FIG. 7(e)).

After a prescribed time period, transfer request signal CI returns to the "H" level (FIG. 7(b)). However, even if transfer request signal CI returns to the level, and the Q output of RS-flipflop 50, the output inverter 58, and transfer acknowledge signal RI are all in the "H" level, NAND gate 104 continues to output the "H" level to its output node G as long as the output INHB of NAND gate 118 is in the "L" level (FIG. 7(f)). The potential of CO output terminal 44 does not attain the "L" level. Accordingly, transfer request signal CO is not output to a transfer control circuit in the succeeding stage (FIG. 7(b)).

As described above, setting mode signal SYNC to the "H" level, transfer control circuit 92 is prohibited from transferring the transfer request signal applied from the transfer control circuit in the preceding stage to the transfer control circuit in the succeeding stage.

When an "H" level signal is applied to clock input terminal 102 by external control, D type flipflop 110 latches the Q output of D type flipflop 112. The Q outputs of flipflops 110 and 112 thus attain the same level. The output of EXOR gate 116 attains the "L" level, and the output INHB of NAND gate 118 is pulled to the "H" level (FIG. 7(e)).

When all the other four inputs are in the "H" level and the output INHB of NAND gate 118 is pulled to the "H" level, the potential of the output node G of NAND gate 104 is pulled to the "L" level (FIG. 7(f)). RS-flipflop 50 is reset. RS-flipflop 54 is set. The $\overline{Q}$ output of RS-flipflop 50 is pulled to the "L" level. Clock pulse CP output from inverter 50 is pulled to the "H" level (FIG. 7(g)). Clock pulse CP becomes a clock input to a corresponding data holding circuit 94 (see FIG. 5).

In response to clock pulse CP, data holding circuit 94 latches input data D and applies the same to a succeeding stage circuit as output data DO. The $\overline{Q}$ output of RS-flipflop 54 is applied to CO output terminal 44 through inverters 56 and 58 and delay element 60. Thus, transfer request signal CO rises at least after a prescribed time period determined by the time constant of delay element 60 since the rise of clock pulse CK (FIG. 7(h)). Data transfer request signal CO is applied to a transfer control circuit in the succeeding stage after a prescribed time delay, and margin for data transfer can be secured.

As described above, first pulling mode signal SYNC to the "H" level thereby prohibiting the transfer of the transfer request signal to the transfer control circuit in the succeeding stage, and then applying an "H" level signal to clock input terminal 102, the transfer request signal whose transfer has been prohibited is applied to the transfer control circuit in the succeeding stage.

Suppose that, after a prescribed time period, transfer acknowledge signal RI from a transfer control circuit in the succeeding stage takes a value indicating transfer prohibition ("L" level) (FIG. 7(i)). When transfer acknowledge signal RI rises to the "L" level, RS-flipflop 54 is reset. In response, clock pulse CP returns to the "L" level, and transfer request signal CO to the "H" level (FIG. 7(e), (h)). Data holding circuit 94 does not latch data, and new data is not transferred to the transfer control circuit in the succeeding stage.

As described above, as long as mode signal SYNC is set to the "H" level, transfer of transfer request signal CI applied to CI input terminal 40 can readily be controlled using clock signal CK by external control. Data transfer can be proceeded on a stage-by-stage basis by setting the levels of mode signal SYNC and clock signal CK to desired levels by external control. Verification of transfer timings and debugging of processing contents can be performed on a step-by-step basis for transfer control circuits, and logic circuits disposed between the data transfer circuits.

As in the foregoing, applying clock signal CK to terminal 102 with mode signal SYNC being fixed to the level permits transfer of data as far as an arbitrary data transmission circuit while controlling data transfer under external control. If mode signal SYNC is changed to the "L" level thereafter, from that point the transfer control circuit starts operating in the autonomous operation mode (self-synchronous type transfer control) the same as the conventional apparatus. Simply setting the level of mode signal SYNC by external control can readily change the operation mode of the transfer control circuit.

It should be further noted that, while mode signal SYNC is maintained "L" level, transfer control portion 108 operates in the same manner as conventional transfer control circuit 14. The timing characteristics will not be degraded although transfer request control portion 106 is additionally provided.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A self-timed clocking transfer control circuit connected to data holding means constituting a data transmission path and responsive to a first signal and a second signal for self-synchronous type transfer control applied from a preceding stage and a succeeding stage, respectively, for applying to said data holding means a data holding signal indicating a timing for holding input data and applying a third signal and a fourth signal for self-synchronous type transfer control to the preceding stage and the succeeding stage, respectively, said first, second, third, and fourth signals each selectively taking either one of first and second values, said self-timed clocking transfer control circuit further being responsive to a prohibition signal indicating whether or not to prohibit self-synchronous type control and selectively taking either one of said first and second values, said self-timed clocking transfer control circuit comprising:

first signal output means for outputting a prescribed signal in response to said first signal taking said first value and stopping output of said prescribed signal in response to a reset signal;

means responsive to said prescribed signal for applying said third signal to the preceding stage;

first logic circuit means for performing a prescribed logic operation to said first signal, said second signal, said prescribed signal, and said fourth signal output by said transfer control circuit, and outputting the result, the output of said first logic circuit means being applied to said first signal output means as said reset signal; and second signal output means responsive to the output of said first logic circuit means and said second signal for outputting said data holding signal and said fourth signal, delaying said fourth signal by a prescribed time period and applying the delayed signal to the succeeding stage, wherein said logic operation in said first logic circuit means is selected so that its result assumes a value which prevents said second signal output means from outputting said fourth signal when said prohibition signal takes said first value.

2. A self-timed clocking transfer control circuit as recited in claim 1, further comprising:

prohibition signal generation means for generating and applying said prohibition signal to said first logic circuit means, in response to a mode signal which assumes either one of first and second values indicating a first operational mode and a second operational mode, respectively, an externally applied clock signal instructing transfer of data in said second operation mode, and said first signal.

3. A self-timed clocking transfer control circuit as recited in claim 2, wherein said prohibition signal generation means includes, means responsive to said clock signal and said first signal for generating a fifth signal defining a time period during which data transfer in said second operational mode is permitted, and second logic circuit means for performing a prescribed logic operation to said fifth signal and said mode signal, thereby outputting the result as said prohibition signal.

4. A self-timed clocking transfer control circuit as recited in claim 3, wherein said second logic circuit means includes AND circuit means for generating said prohibition signal, when said fifth signal assumes the value indicating that it is in the time period in which said data transfer is acknowledged and said mode signal assumes the value indicating said second operational mode.

5. A self-timed clocking transfer control circuit as recited in claim 4, wherein said means for generating the fifth signal includes means for generating a signal alternately taking said first value and said second value and outputting either one of the values as said fifth signal, in response to a transition of said clock signal from a first level to a second level and a transition of said first signal from said second value to said first value.

6. A self-timed clocking transfer control circuit as recited in claim 5, wherein said first value is of a low level, said second value is of a high level, and said AND circuit means includes an NAND gate circuit.

7. A self-timed clocking transfer control circuit as recited in claim 6, wherein said means for generating said signal alternately taking said first value and said second value includes, inversion means having an input for receiving said first signal and inverting the level of said first signal, and first and second D type flipflops each having a data input, a clock input, and a Q output, wherein said first D type flipflop further has a $\bar{Q}$ output, said data input of said first D type flipflop is connected to said Q output of said second D type flipflop, said clock input of said first D type flipflop is connected so as to receive said clock signal, said data input of said second D type flipflop is connected to said $\bar{Q}$ output of said first D type flipflop, said clock input of said second D type flipflop is connected to the output of said inversion means, and said means for generating said signal alternately taking said first value and said second value further includes an EXOR circuit having two inputs connected to said Q outputs of said first and second D type flipflops, respectively.

8. A self-timed clocking transfer control circuit as recited in claim 1, wherein said first value is logic 0, said second value is logic 1, said prohibition signal selectively takes the logic 0 or 1, and said first logic circuit means includes AND circuit means.

9. A self-timed clocking transfer control circuit as recited in claim 8, wherein logic 0 is represented by a low level of a signal, logic 1 is represented by a high level of a signal, said AND circuit means includes a 5-input NAND gate connected so as to receive said prohibition signal at its first input, said first signal at its second input, the output of said first signal output means at its third input, said third signal at its fourth input, and the output of said second signal output means at its fifth input.

* * * * *